United States Patent
McCarthy et al.

(10) Patent No.: US 7,778,057 B2
(45) Date of Patent: Aug. 17, 2010

(54) PCB CIRCUIT MODIFICATION FROM MULTIPLE TO INDIVIDUAL CHIP ENABLE SIGNALS

(75) Inventors: Michael McCarthy, San Jose, CA (US); Ning Ye, San Jose, CA (US); Naveen Kini, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 583 days.

(21) Appl. No.: 11/679,157

(22) Filed: Feb. 26, 2007

(65) Prior Publication Data

US 2008/0208384 A1  Aug. 28, 2008

(51) Int. Cl.
G11C 5/02 (2006.01)
(52) U.S. Cl. .............. 365/51; 365/63; 365/185.11; 365/201; 365/230.03
(58) Field of Classification Search .............. 257/679, 257/686; 365/51, 52, 63, 185.01, 185.11, 365/191, 201, 230.03
See application file for complete search history.

(56) References Cited

U.S. PATENT DOCUMENTS

| | | | |
|---|---|---|---|
| 6,573,567 B1 * | 6/2003 | Nishizawa et al. ......... 257/358 |
| 6,661,718 B2 | 12/2003 | Ohlhoff et al. | |
| 7,259,028 B2 * | 8/2007 | Takiar et al. ............. 438/15 |
| 7,352,199 B2 * | 4/2008 | Chhor et al. ............. 324/765 |
| 7,389,937 B2 * | 6/2008 | Ito ......................... 235/492 |
| 2005/0013106 A1 * | 1/2005 | Takiar ..................... 361/684 |
| 2008/0206904 A1 * | 8/2008 | McCarthy et al. ......... 438/15 |
| 2009/0153163 A1 * | 6/2009 | Han et al. ................ 324/754 |

* cited by examiner

*Primary Examiner*—Dang T Nguyen
*Assistant Examiner*—Alexander Sofocleous
(74) *Attorney, Agent, or Firm*—Vierra Magen Marcus & DeNiro LLP

(57) ABSTRACT

A semiconductor package is discussed having a single CE signal during electrical test and a plurality of CE signals during normal operation thereafter. After electrical testing of the memory die during fabrication, the electrical traces carrying the single CE signal from the memory test pad matrix to each of the memory die may be severed. Severing the electrical traces from the memory test pad matrix electrically isolates the multiple electrical traces between the controller die and memory die, and allows separate and individual CE signals between the controller die and memory die during normal usage of the memory die.

17 Claims, 13 Drawing Sheets

PCB CIRCUIT MODIFICATION FROM MULTIPLE TO INDIVIDUAL CHIP ENABLE SIGNALS

CROSS-REFERENCE TO RELATED APPLICATIONS

The following application is cross-referenced and incorporated by reference herein in its entirety:

U.S. patent application Ser. No. 11/679,153, entitled "METHOD OF MAKING PCB CIRCUIT MODIFICATION FROM MULTIPLE TO INDIVIDUAL CHIP ENABLE SIGNALS," by Michael McCarthy et al., filed concurrently herewith.

BACKGROUND OF THE INVENTION

1. Field of the Invention

The present disclosure relates to technology for fabricating integrated circuits such as semiconductor memory devices.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones. Electrically Erasable Programmable Read Only Memory (EEPROM), including flash EEPROM, and Electrically Programmable Read Only Memory (EPROM), are among the most popular non-volatile semiconductor memories.

As with most storage devices, defects occur to some of the semiconductor memory components or storage areas during fabrication. For example, the individual storage elements or memory cells of a semiconductor memory array may be defective. Additionally, the peripheral circuitry for the memory array, including word lines, bit lines, decoders, etc., may be defective, rendering the associated storage elements defective as well.

Portions of a typical semiconductor memory fabrication process are shown in the flowchart of FIG. 1. In step 20, wafer level testing is conducted prior to packaging the memory chips to form memory devices. A wafer can include hundreds or thousands of memory chips, each of which will include a memory array and peripheral components such as the control and logic circuits for accessing the memory cells of the array. During wafer level testing 20, the functionality of the memory chips is tested so that defective components are not needlessly integrated into a packaged device.

After wafer level testing 20, the wafer is divided into individual memory chips and one or more of the memory chips are mounted to a substrate, possibly along with a controller chip, and electrical connections are formed in step 22. In particular, the substrate may include a conductance pattern of photolithographically defined electrical traces. The controller and memory chips may be die bonded and electrically connected to the substrate to allow electrical communication between the controller chip and memory chips, as well as between the chip set and the outside world. After bonding and electrical connection in step 22, the die and substrate may be packaged in step 24 by encapsulating the die and substrate in a molding compound.

The packaged memory devices are then subjected to burn-in and electrical test processes in steps 26 and 28, respectively. Burn-in is performed to stress the memory arrays and peripheral circuitry of the chips. Burn-in is typically conducted at elevated temperatures (e.g., 125° C.) at which high voltages are applied at various portions of each chip to stress and identify weaker elements. Those die packages passing burn-in may undergo an electrical test in step 28. Referring to FIG. 2, during the burn-in and/or electrical test, electrical function of the package may be tested using a memory test pad matrix 32 provided within the package.

The memory test pad matrix 32 includes a plurality of electrical test pads 34 exposed through the molding compound and connected to the memory die within the package. During burn-in and/or electrical test, the package may be inserted into a socket on a test card, whereupon the test pads are contacted by probes to test the electrical properties and functioning of the semiconductor package to determine whether the finished semiconductor package performs per specification. Assuming the package passes electrical inspection, the memory test pad matrix 32 may then be covered (as for example by a sticker or ink-jet printing). FIG. 2 also shows a plurality of contact fingers 36 for electrical connection of the package 30 with the outside world.

FIG. 3 is a schematic top view of a portion of a semiconductor package 30 prior to the encapsulation step. The package 30 includes a controller die 40, such as for example an ASIC, and a plurality of memory die 42, as well as the memory test pad matrix 32 discussed above. There is also shown electrical connections for carrying a chip enable signal between the controller die 40 and each of the memory die 42. As is known, during normal usage of the package 30, when read, write or erase operations (generally indicated by arrow 46) are to be performed with the memory die 42, the memory die 42 must first be enabled via a chip enable ("CE") signal from the controller die 40 to the memory die 42. As shown, the CE signal may travel over traces 48, which are shorted together and lead to each of the memory die. Accordingly, when a CE signal is sent from the controller die 40, it is sent to each of the memory die 42 together so as to enable each of the memory die 42 even where read/write/erase operations are taking place on only one of the memory die.

In the package test phase (steps 26 and/or 28, FIG. 1), the memory die 42 are accessed directly from the memory test pad matrix 32, bypassing the controller die 40. During the test phase, when read, write or erase test operations (generally indicated by arrow 50) are to be performed with the memory die 42, the memory die must first be enabled by a CE signal sent from the memory test pad matrix 32. As shown, a trace 48 may extend from a CE signal test pad 34 in the matrix 32 and connect to the same traces 48 used to carry the CE signal from the controller. Accordingly, during test, when a CE signal is sent from the memory test pad matrix 32, it is sent to each of the memory die 42 together.

In certain semiconductor packages, there is a drive to reduce power consumption in the package. In the package 30 shown in FIG. 3, whenever a CE signal is sent, it is sent to each of the memory die 42, even though the read/write/erase operation may be occurring on a single memory die 42. Accordingly, there are power saving advantages to separating the CE signal into separate signals, one signal for each memory die in the package, so that the memory die may be individually enabled.

A problem arises however in that the same traces are used to transmit the CE signal both during electrical test and during normal operations thereafter by the controller die 40. While separate CE signals are feasible off of the controller die 40, it is difficult to provide separate CE signals from the memory test pad matrix 32 during the electrical test phase. There typically is not enough room on the test pad matrix to add enough additional pads to provide one CE signal for each memory die during test. Moreover, redesign of the memory test pad matrix would also require redesign of all of the test sockets which perform the electrical testing via the memory test pad matrix. Further still, the power saving issues which may exist during normal usage read/write/erase operations do not exist during the testing phase.

Accordingly, there is a need for a semiconductor package including a single CE signal for enabling the memory chips during the electrical test phase of the package, but which also allows for CE signals to be sent to individual memory die during normal read/write/erase operations thereafter.

SUMMARY OF THE INVENTION

The invention, roughly described, relates to a semiconductor package having a single CE signal during electrical test and a plurality of CE signals during normal operation thereafter. The memory package includes a number of individual memory die and a controller die mounted on a substrate. The substrate further includes a memory test pad matrix for testing the memory die during fabrication to identify defective memory die. A conductance pattern is also defined in the substrate including electrical traces for electrically coupling the controller die to the memory die and for electrically coupling the memory test pad matrix to the memory die.

After mounting the die on the substrate, the package may be encapsulated in a molding compound. The molding compound covers the controller and memory die. However, a window is left without molding compound, through which the memory test pad matrix and portions of the electrical traces are visible and left exposed.

After packaging, burn-in and electrical test processes may be performed to test the electrical function of the memory die using the memory test pad matrix. The memory test matrix may include a CE signal test pad for enabling the memory die during testing. In particular, during burn-in and/or electrical tests, a probe may be brought into contact with the CE signal test pad to supply a CE signal voltage to the test pad. The CE signal test pad is coupled to each of the memory die so that the CE signal voltage applied to the CE signal test pad is transmitted to each of the memory die together to enable each of the memory die for testing.

In an embodiment, the conductance pattern is defined so that the CE signals from the controller die are electrically shorted together by their common connection to the electrical traces emanating from the memory text pad matrix. After burn-in and electrical tests, the shorted CE signal electrical traces from the memory pad test matrix may be severed to allow the individual CE signals from the controller die to be communicated separately and individually to respective memory die. While the electrical traces from the memory test pad matrix may be severed by a variety of means, the traces may be severed by a laser in one embodiment. In alternative embodiments, the traces may be severed by chemical etching, punching, or other methods. After the traces have been severed, the memory test pad matrix and exposed portions of the electrical traces may be covered with a cover.

In a further embodiment of the present invention, the electrical traces emanating from the memory test pad matrix may be defined in the conductance pattern with a discontinuous break, or gap, along their length. In such an embodiment, prior to electrical testing, the discontinuous gap may be covered by an electrical conductor to electrically short together the electrical traces from the test pad matrix, as well as the CE signals between the controller and memory die. After electrical testing, the electrical conductor may be removed, to thereby isolate the CE signals between the controller and memory die and allow the individual CE signals from the controller die to be communicated separately and individually to respective memory die.

In further embodiments of the present invention, it is contemplated that the CE signal test pad be configured in such a way so as to remove the need to sever the electrical traces from the CE signal test pad after burn-in and electrical tests. In one such embodiment, the conductance pattern is formed on the PCB so that respective traces contact four or more separate and electrically distinct areas on the CE signal test pad (the traces may contact as many areas as there are memory die). Accordingly, each of the traces from the CE signal test pad is electrically isolated from each other, and the controller die can communicate individual CE signals to one or more of the memory die without having to sever any of the traces. In this embodiment, during burn-in and/or electrical tests, a probe may be brought into contact with a probe landing area on the CE signal test pad. The probe establishes electrical contact with each of the electrically conductive areas on the test pad, so that a CE signal may be provided to each of the memory die together during testing.

DETAILED DESCRIPTION

Embodiments will now be described with reference to FIGS. 4 through 20, which relate to a semiconductor package having a single CE signal during electrical test and a plurality of CE signals during normal operation thereafter. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
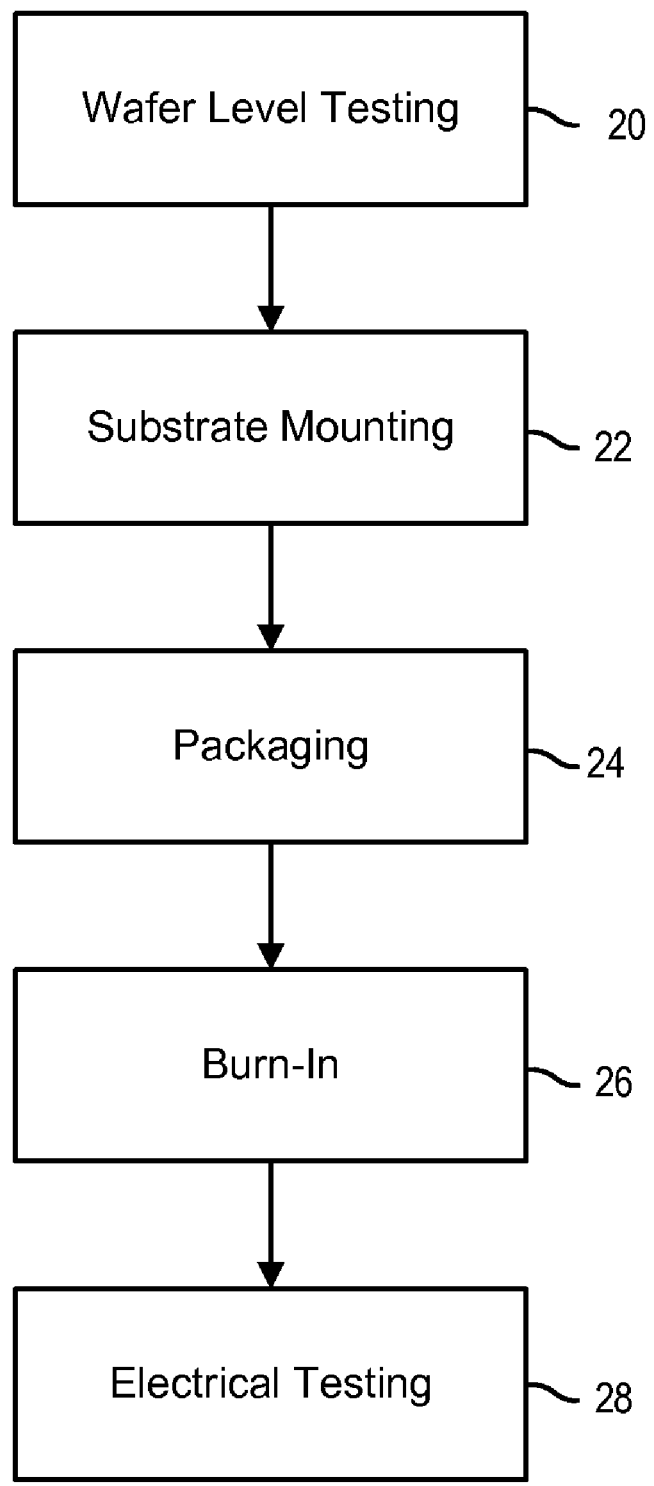
FIG. 1 is a flowchart of some steps involved in the fabrication of a conventional semiconductor package.
Figure 2:
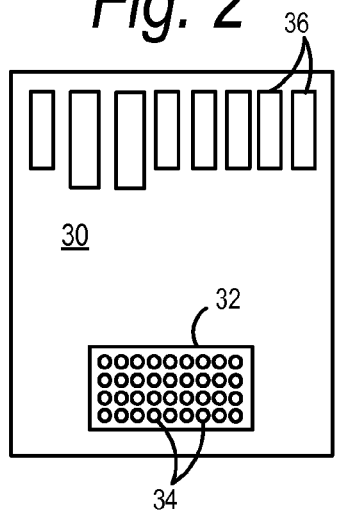
FIG. 2 is a top view of a conventional semiconductor package after encapsulation with a memory test pad matrix exposed through the molding compound.
Figure 3:
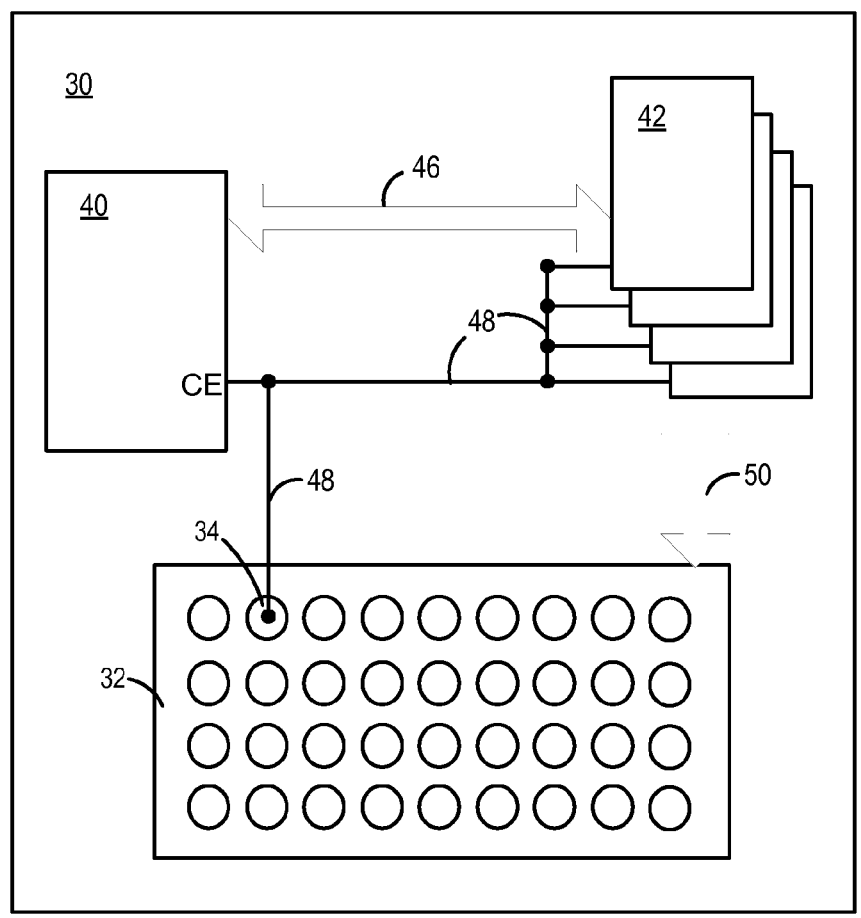
FIG. 3 is a top view of a conventional semiconductor package including CE traces shorted together from both the controller die and the memory test pad matrix.
Figure 4:
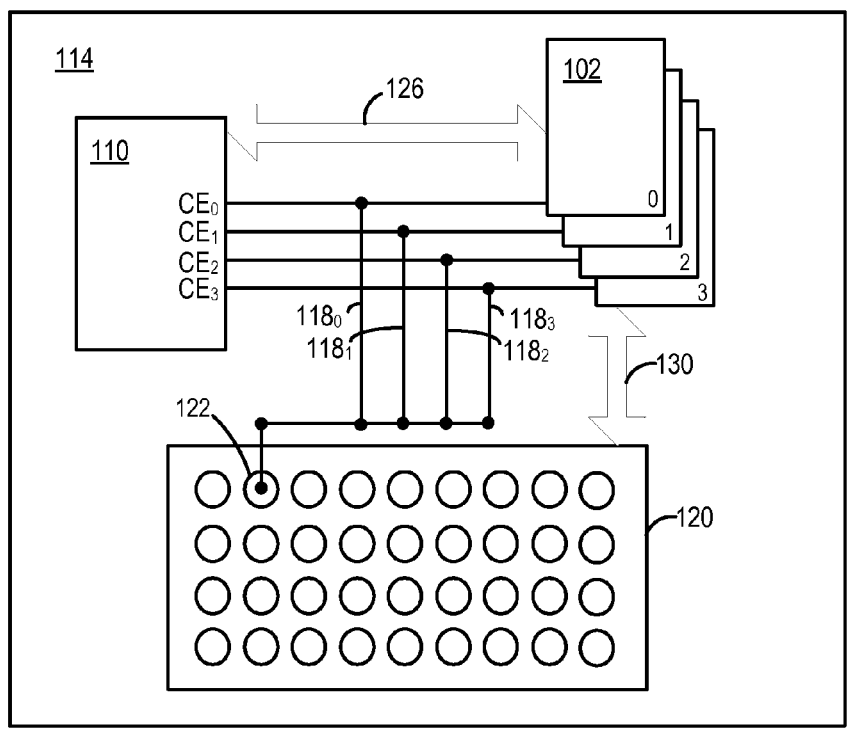
FIG. 4 is a top view of a semiconductor package according to an embodiment of the present invention in a first stage of fabrication.

FIG. 4 schematically illustrates a non-volatile memory package 100 (shown in FIG. 4 prior to encapsulation). The memory package 100 includes a number of individual memory die 102 and a controller die 110 which may be mounted on a substrate 114. The substrate 114 further includes a memory test pad matrix 120 for testing the memory die as explained hereinafter. Substrate 114 may be a variety of different chip carrier mediums, including a printed circuit board ("PCB"), a leadframe or a tape automated bonded (TAB) tape. Where substrate 114 is PCB, the substrate may be formed of a core, having top and/or bottom conductive layers. The core may be formed of various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42Fe/58Ni), copper plated steel, or other metals and materials known for use on substrates. The top and/or bottom layers may be etched with a conductance pattern 118 for communicating signals between the controller die and memory die, and the memory test pad matrix and the memory die, as explained hereinafter. The conductance pattern 118 may be formed by a variety of processes including by photolithography. In such a process, a photoresist film may be applied over the surfaces of the conductive layers. A pattern mask containing the outline of the electrical conductance pattern, including in part electrical traces $118_0$ through traces $118_3$, may then be placed over the photoresist film. The photoresist film may then be exposed and developed to remove the photoresist from areas on the conductive layers that are to be etched. The exposed areas are next etched away using an etchant such as ferric chloride to define the conductance patterns on the core. The photoresist may then be removed. Other known methods for forming the conductance pattern on substrate 114 are contemplated. After the conductance pattern is formed, portions of the conductance pattern which form contact pads may be plated with gold or other materials in a known plating process.

The memory die 102 and controller die 110 may next be wire bonded to the plated contact pads of the conductance pattern 118 in a known wire bond process to electrically couple the memory die 102 to the controller die 110 via the conductance pattern. The memory test pad matrix 120 may be coupled to the conductance pattern 118 (or formed as part of the conductance pattern) to allow communications between the test pad matrix 120 and the memory die 102 as explained hereinafter.

While four memory die 102 are shown, numbered 0 through 3 respectively, it is understood that the number of memory die 102 may vary in alternative embodiments, such as for example between one and eight. While the memory die 102 are shown stacked and offset from each other along two axes, it is understood that the memory die may be stacked with an offset along a single axis, or simply stacked on top of each other without any offset. Where there is no offset, the die 102 may be separated by a spacer layer as is known in the art.

Each memory die 102 may include a non-volatile memory array formed of individual non-volatile memory cells. The memory array can include, but is not limited to, flash memory cells arranged using architectures such as the NAND and NOR architectures. The controller die 110 may for example be an ASIC and is included to control memory operations between a host device and the individual memory die 102. The controller die 110 is capable of independently addressing each memory die of the system. It is not necessary that a controller be included in the memory system. For instance, some implementations may have the controller functionality handled by the host device, such as by a processor of a standard processor-based computing system.

Although not shown, the controller die 110 and each memory die 102 may include a plurality of pinout positions defined for example by bond pads on the surface of each die. In addition to the portion of conductance pattern 118 shown, the conductance pattern may additionally include electrical traces connected between the controller die bond pads and the individual memory die bond pads. These electrical traces are used for transferring power and data between the controller die 110 and the memory die 102 to allow read, write and erase operations within the flash memory cells of the memory die, under the control of controller die 110. These power and data connections are collectively represented by arrow 126. Similarly, power and data connections are provided between the pinout positions for each memory die and the pads of the memory test pad matrix 120. These power and data connections are collectively represented by arrow 130.

Figure 5:
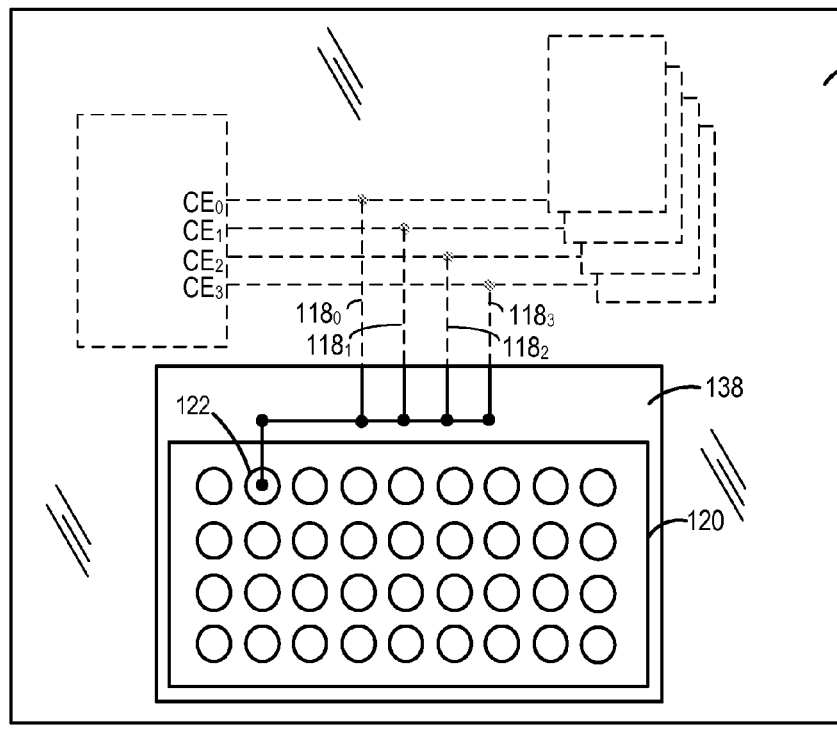
FIG. 5 is a top view of a semiconductor package according to an embodiment of the present invention in a second stage of fabrication.
Figure 6:
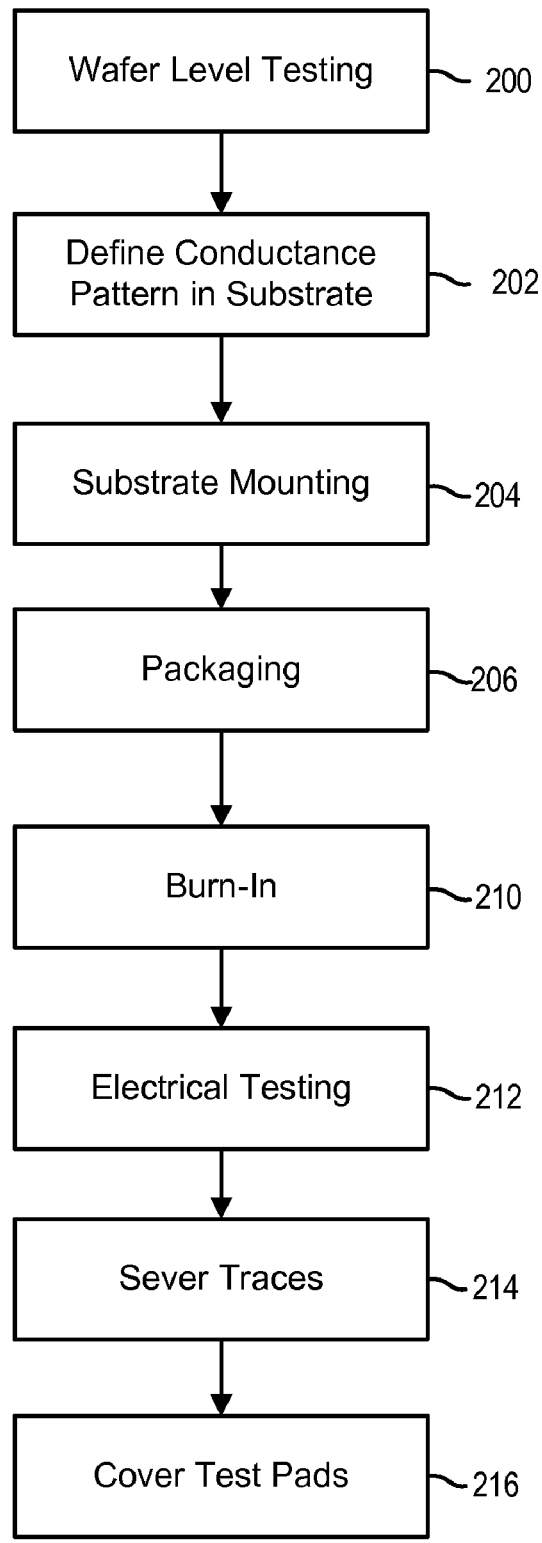
FIG. 6 is a flowchart for the fabrication of a semiconductor package according to an embodiment of the present invention.

Referring now to the flowchart of FIG. 6, in the initial steps of fabrication described above, the die are tested at the wafer level (step 200), the conductance pattern is defined on the substrate (step 202), and the die are mounted and connected to the substrate (step 204). In step 206, the package 100 may be encapsulated in a molding compound 136, such as for example shown in FIG. 5. Although not critical to the present invention, molding compound 136 may be an epoxy such as for example available from Sumito Corp. or Nitto Denko Corp., both having headquarters in Japan. Other molding compounds from other manufacturers are contemplated. The molding compound may be applied according to various processes, including by transfer molding or injection molding techniques. The molding compound covers the controller and memory die. However, a window 138 is left without molding compound, through which the memory test pad matrix 120 and portions of electrical traces $118_0$ through $118_3$ are visible and left exposed.

Referring now to step 210, after packaging, burn-in may be performed to stress the memory arrays and peripheral circuitry of the chips. Burn-in may be conducted at approximately 125° C. with high voltages applied at various pins of each memory die 102 to stress and identify weaker die. After burn in, electrical testing may be performed in step 212. Numerous types of package-level electrical tests can be applied, including by way of example, bit and word line tests to detect faults, shorts, etc., memory cell tests for reading, writing, and data retention, peripheral circuitry tests, etc. It is understood that the burn-in or electrical test may be omitted, and that further alternative tests may be performed using the memory test pad matrix 120, in embodiments of the invention.

Referring to FIG. 5, during the burn-in and/or electrical test, electrical function of the package may be tested using memory test pad matrix 120. Memory test pad matrix 120 may include a CE signal test pad 122. It is understood that CE signal test pad 122 may be located at other positions on a memory test pad matrix 120 in alternative embodiments. During burn-in and/or electrical tests, a probe (not shown in FIG. 5) may be brought into contact with CE signal test pad 122 to supply a CE signal voltage to pad 122. As each of the traces $118_0$ through $118_3$ are electrically shorted together, the CE signal voltage applied to pad 122 is transmitted to each of the memory die $102_0$ through $102_3$ to enable each of the memory die for testing.

As shown in FIG. 5, the conductance pattern 118 is defined so that the CE signals $CE_0$ through $CE_3$ from the controller die 110 are electrically shorted together by their common connection to electrical traces $118_0$ through $118_3$. Referring now to step 214 and the top view of FIG. 7A, after burn-in and electrical tests, the shorted CE signal electrical traces $118_0$ through $118_3$ coming from the memory test pad matrix 120 may be severed to allow individual CE signals $CE_0$ through $CE_3$ to be communicated separately and individually from controller die 110 to respective memory die $102_0$ through $102_3$.

Those of skill in the art will appreciate a number of ways of severing the shorted CE signal electrical traces $118_0$ through $118_3$ coming from the memory test pad matrix 120. In one embodiment, the respective traces $118_0$ through $118_3$ may be severed using a laser applied to the substrate across the traces $118_0$ through $118_3$ in an area 140 exposed within the window 138 formed in molding compound 136. A variety of lasers may be used for severing traces $118_0$ through $118_3$ including for example $CO_2$ lasers, UV lasers, $YBO_4$ lasers, argon lasers, etc. Such lasers are manufactured for example by Rofin-Sinar Technologies of Hamburg, Germany.

Those of skill in the art will appreciate that traces $118_0$ through $118_3$ may be severed by a variety of processes other than lasing. For example, traces $118_0$ through $118_3$ may be chemically etched in a photolithography or other process. Alternatively, a portion of the substrate 114 including area 140 may be punched from the substrate leaving a hole in the substrate and severed traces. While FIG. 5 shows a particular location for area 140 where traces $118_0$ through $118_3$ are severed, it is understood that traces $118_0$ through $118_3$ may be severed anywhere along their respective lengths so as to leave CE signals $CE_0$ through $CE_3$ between the controller die and memory die electrically isolated from each other and intact. While embodiments disclose severing traces $118_0$ through $118_3$ where they are visible and exposed within window 138, the location where the traces $118_0$ through $118_3$ are severed may be beneath the molding compound 136 in further embodiments. Moreover, while the severing of traces $118_0$ through $118_3$ has been described as taking place in a single process, it is understood that one or more of the respective traces $118_0$ through $118_3$ may be severed at different times, in different processes, and may occur at different positions along their length with respect to others of the electrical traces.

Figure 7A:
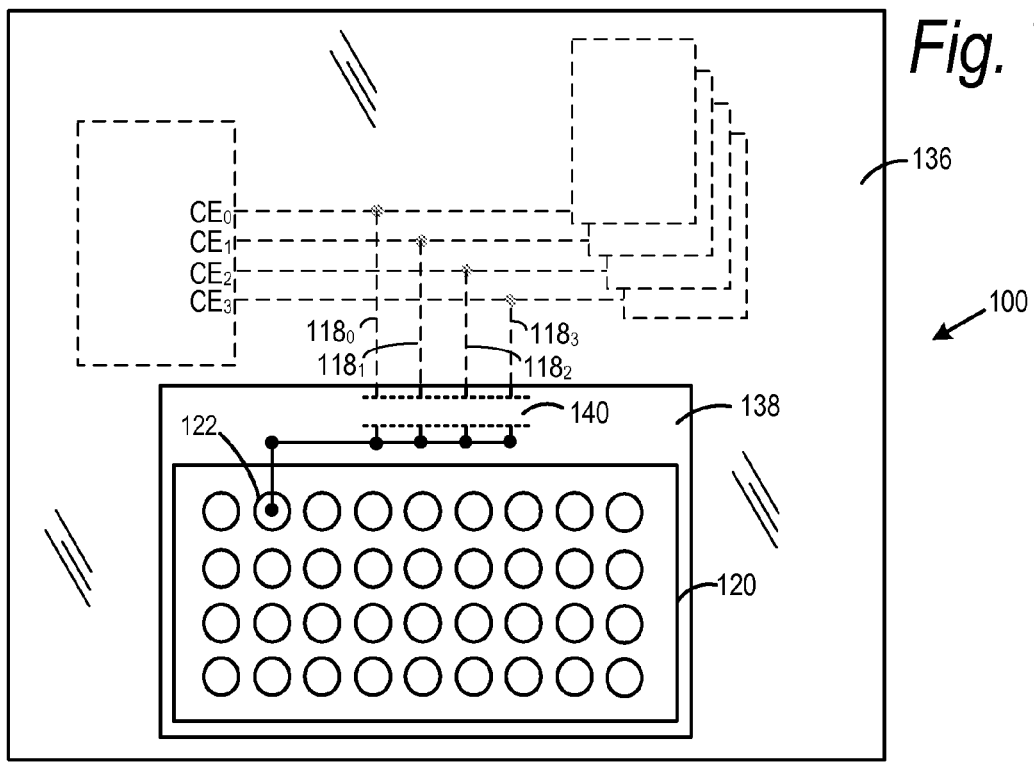
FIG. 7A is a top view of a semiconductor package according to an embodiment of the present invention in a third stage of fabrication.
Figure 7B:
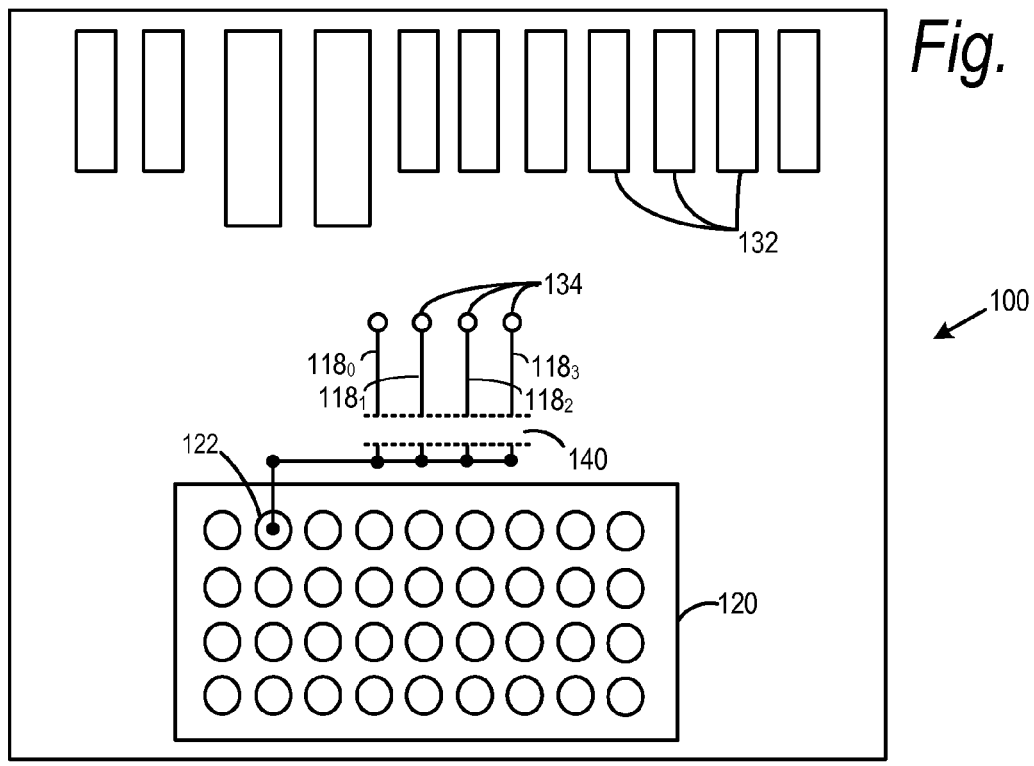
FIG. 7B is a bottom view of a memory package according to an embodiment of the present invention where the memory test pad matrix is positioned on a back side of the memory package.

In embodiments of the present invention, the memory test pad matrix 120 may be formed on the back side of the package 100. Such an embodiment is shown in FIG. 7B. In FIG. 7B, contact fingers 132 are seen for establishing electrical connection between the package 100 and a host device. It is known that the back side of a package may not be encapsulated in molding compound (only the front side including the memory die and controller die would be encapsulated). Thus, in the embodiment of FIG. 7B, the molding compound 136 is not shown and there is no window 138. In this embodiment traces $118_0$ through $118_3$ may come off of the CE signal test pad 122 as shown and connect to the front side of the package through vias 134 formed in a known manner through substrate 114. There may be separate vias 134, or there may be a single via where the traces come together and connect to the front side of the package as one.

The traces $118_0$ through $118_3$ in the embodiment of FIG. 7B may be cut as described above. They may be cut together as shown in an area 140, or they may be cut individually, anywhere along their length before terminating at vias 134. Any of the embodiments described herein may operate with a memory test pad matrix on the back side of the package 100. In embodiments, it is conceivable that the memory test pad matrix be provided on the back side of the package, but the traces $118_0$ through $118_3$ may be cut and severed from each other on the front side of the package.

Figure 8A:
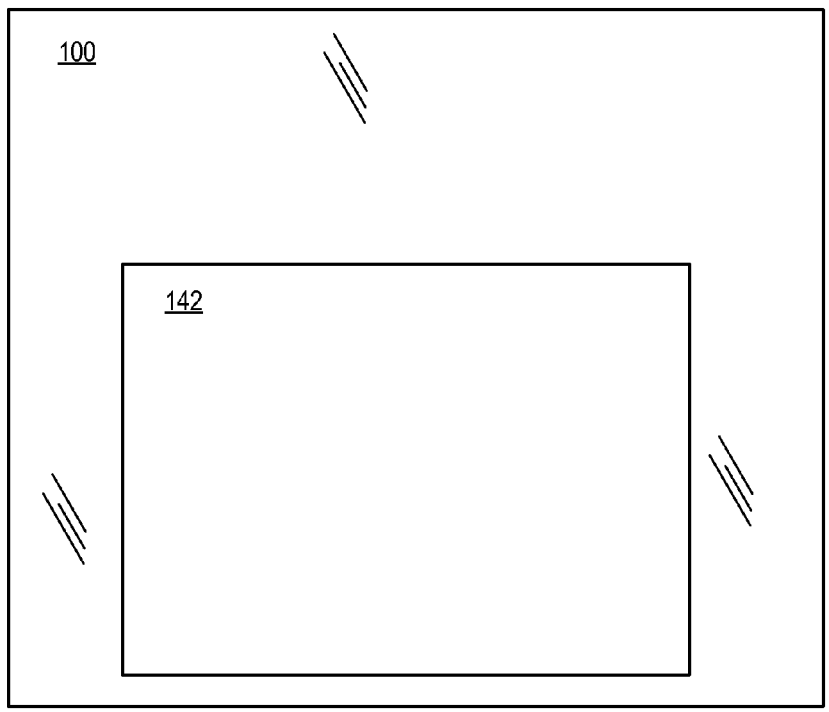
FIG. 8A is a top view of a completed semiconductor package according to an embodiment of the present invention.
Figure 8B:
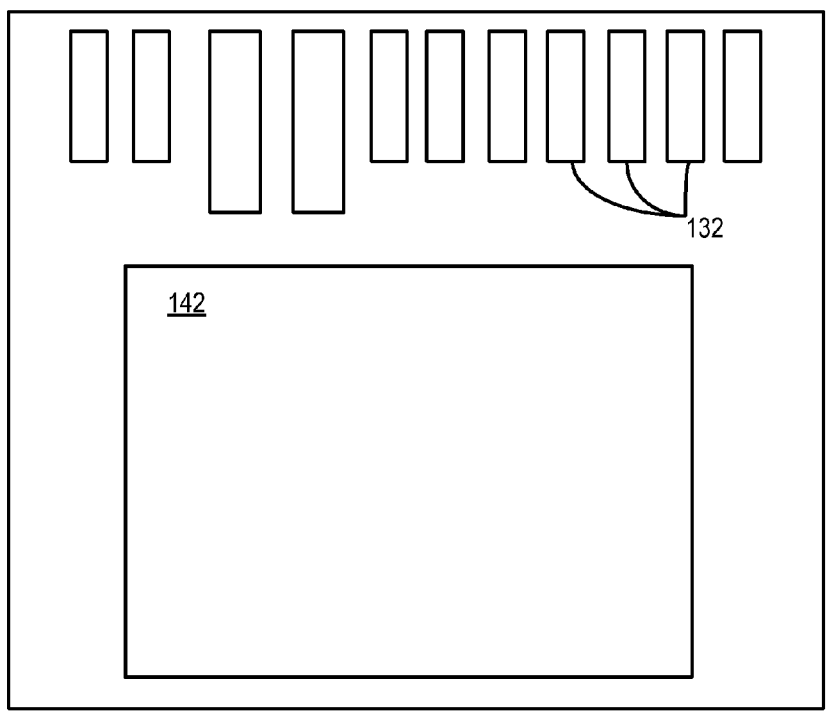
FIG. 8B is a bottom view of a completed memory package according to an embodiment of the present invention where the memory test pad matrix is positioned on a back side of the memory package.
Figure 9:
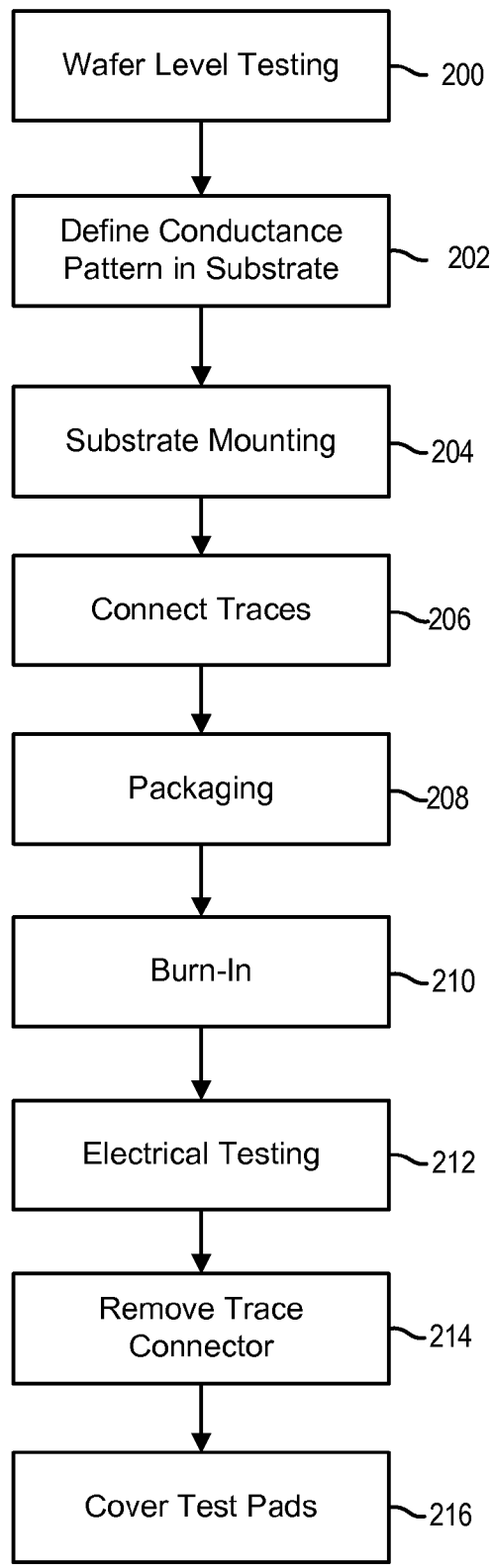
FIG. 9 is a flowchart for the fabrication of a semiconductor package according to an alternative embodiment of the present invention.

After traces $118_0$ through $118_3$ have been severed, the memory test pad matrix 120 and exposed portions of traces $118_0$ through $118_3$ may be covered with a cover 142 in step 216 and as shown in FIGS. 8A and 8B. Where the memory test pad matrix is provided on the front side of the package, the cover may cover the window 138 (FIG. 8A). Where the memory test pad matrix is provided on the back side of the package, the cover may simply cover the memory test pad matrix 120, the traces 118$_0$ through 118$_3$ and the vias 134 (FIG. 8B). The cover 142 may be an adhesive sticker or a layer applied by ink-jet printing or other process.

Figure 10:
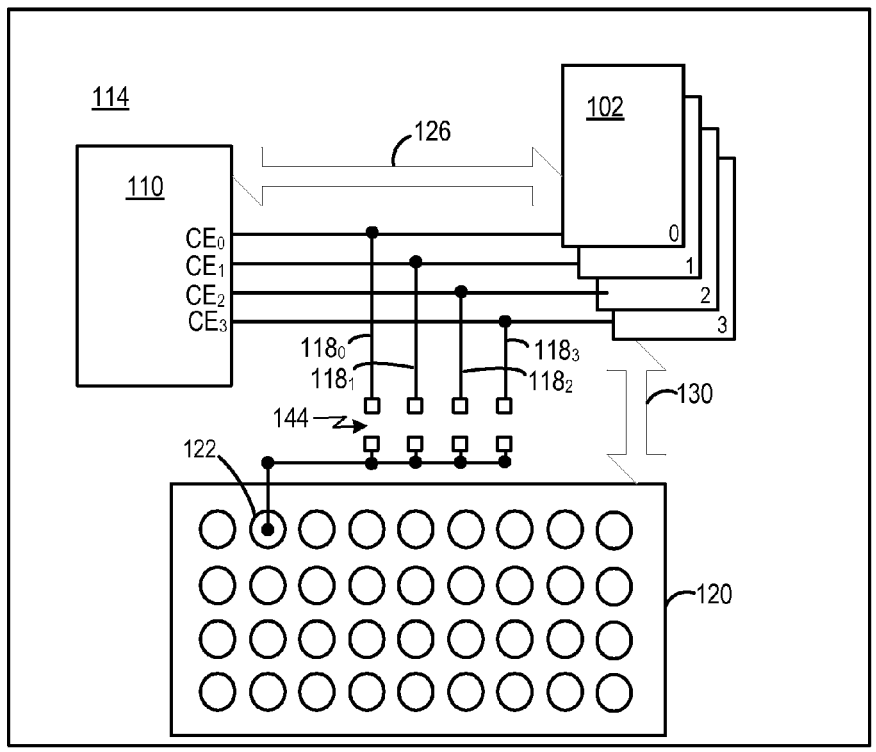
FIG. 10 is a top view of a semiconductor package according to an alternative embodiment of the present invention in a first stage of fabrication.
Figure 11:
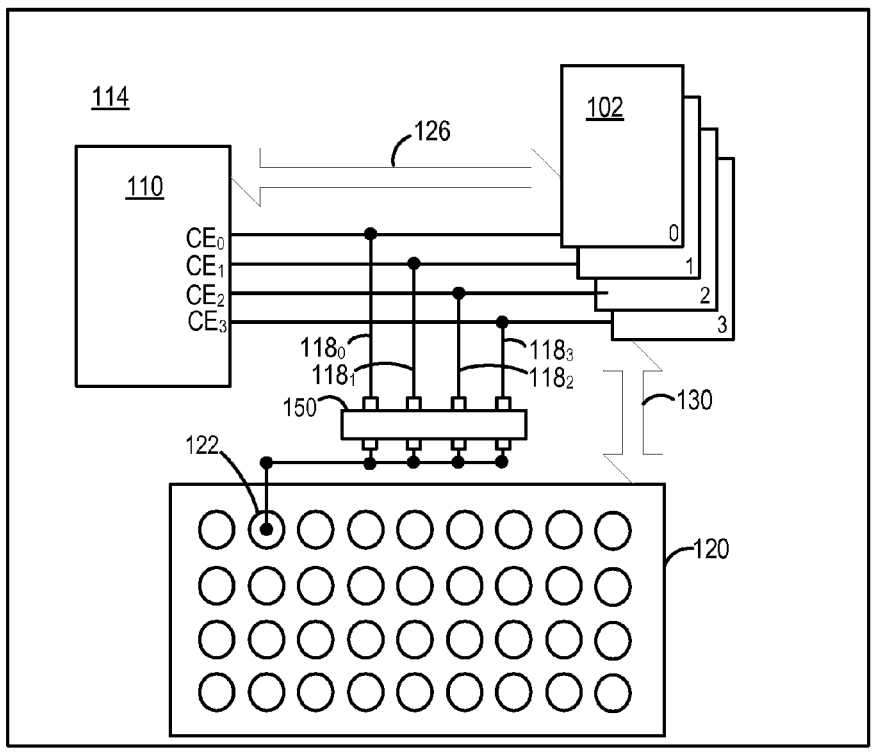
FIG. 11 is a top view of a semiconductor package according to an alternative embodiment of the present invention in a second stage of fabrication.
Figure 12:
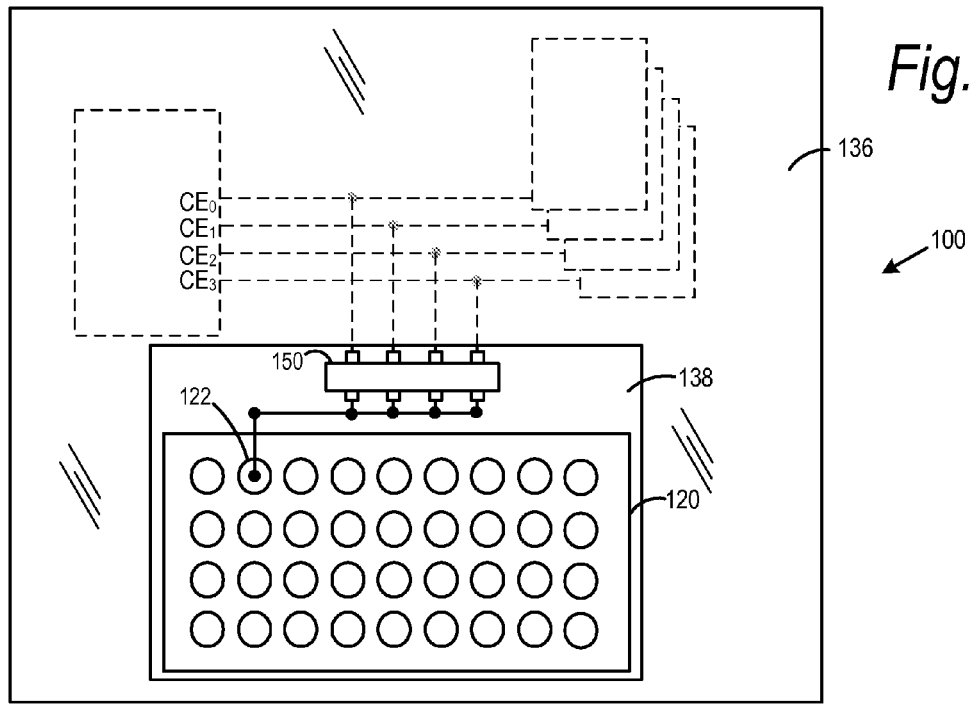
FIG. 12 is a top view of a semiconductor package according to an alternative embodiment of the present invention in a third stage of fabrication.

In the embodiment described above, electrical traces 118$_0$ through 118$_3$ were initially defined in the conductance pattern 118 as being electrically shorted together. In a further embodiment of the present invention described with respect to FIGS. 9 through 14, electrical traces 118$_0$ through 118$_3$ may be defined in the conductance pattern 118 with a discontinuous break, or gap, along their length. Referring to the flowchart of FIG. 9, the controller and memory die may be tested at the wafer level in a step 200. In a step 202, the conductance pattern may be defined within the substrate 114. In accordance with this embodiment, as shown in FIG. 10, each of the electrical traces 118$_0$ through 118$_3$ may be electrically isolated from each other as a result of a discontinuity of the electrical traces defined in the conductance pattern at an area 144. The die may be mounted and electrically connected to PCB 114 in step 204 as described above.

In a step 206, prior to performing burn-in and electrical tests, each of the electrical traces 118$_0$ through 118$_3$ may be shorted together. For example, in the embodiments shown in FIG. 11, an electrically conductive element 150 may be placed over the area 144 to electrically short each of the traces 118$_0$ through 118$_3$ together. In embodiments, element 150 may be a piece of electrically conductive tape. It is understood that element 150 may be other materials in further embodiments.

In step 208, the package 100 may be encapsulated in a molding compound 136 as described above and such as for example shown in FIG. 12. The molding compound 136 covers the controller die 110 and memory die 102. However, a window 138 is left without molding compound, through which the memory test pad matrix 120, conductive element 150 and portions of electrical traces 118$_0$ through 118$_3$ are visible and left exposed. In alternative embodiments, the step 208 of encapsulation may take place prior to the step 206 of applying the conductive element 150 across traces 118$_0$ through 118$_3$.

Figure 13:
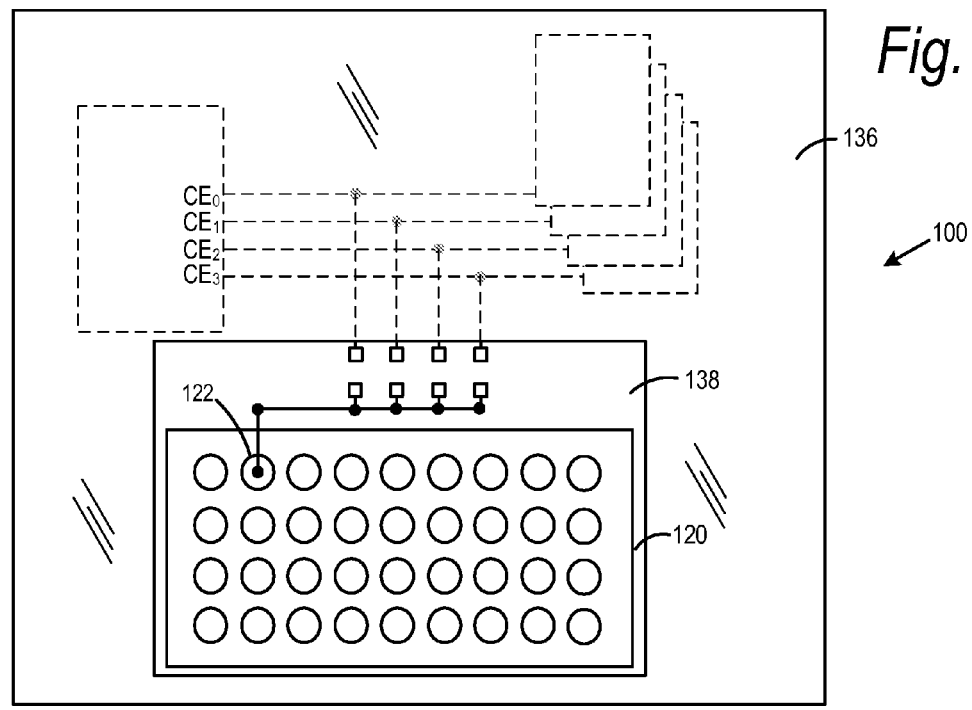
FIG. 13 is a top view of a semiconductor package according to an alternative embodiment of the present invention in a fourth stage of fabrication.

Thereafter, with the traces 118$_0$ through 118$_3$ shorted together by element 150, burn-in and electrical tests may be performed in steps 210 through 212 as described above. A probe may contact the CE signal test pad 122 to enable each of the memory die together during the test process. After burn-in and electrical tests, the electrical connector 150 may be removed from traces 118$_0$ through 118$_3$ in a step 214 and as shown in FIG. 13. At that point, each of the electrical traces 118$_0$ through 118$_3$ are electrically isolated from each other, and separate and distinct CE signals may be transmitted from controller die 110 to one or more of the memory die 102. Instead of a conductive tape, element 150 may be made of solder having a low melting point, so that after testing, the substrate 114 may be heated and the solder removed.

It is understood that an embodiment including traces shorted together by a conductive element 150 may also be employed where the memory test pad matrix 120 is provided on the back side of the package 120, as described above with respect to FIG. 7B. In such an embodiment, the traces on the back side of the package may be formed with a gap between their connection to the CE signal test pad 122 and their termination at the one or more vias 134. These gaps may be shorted together during testing by the conductive element 150, which is removed after the test processes are completed.

Figure 14:
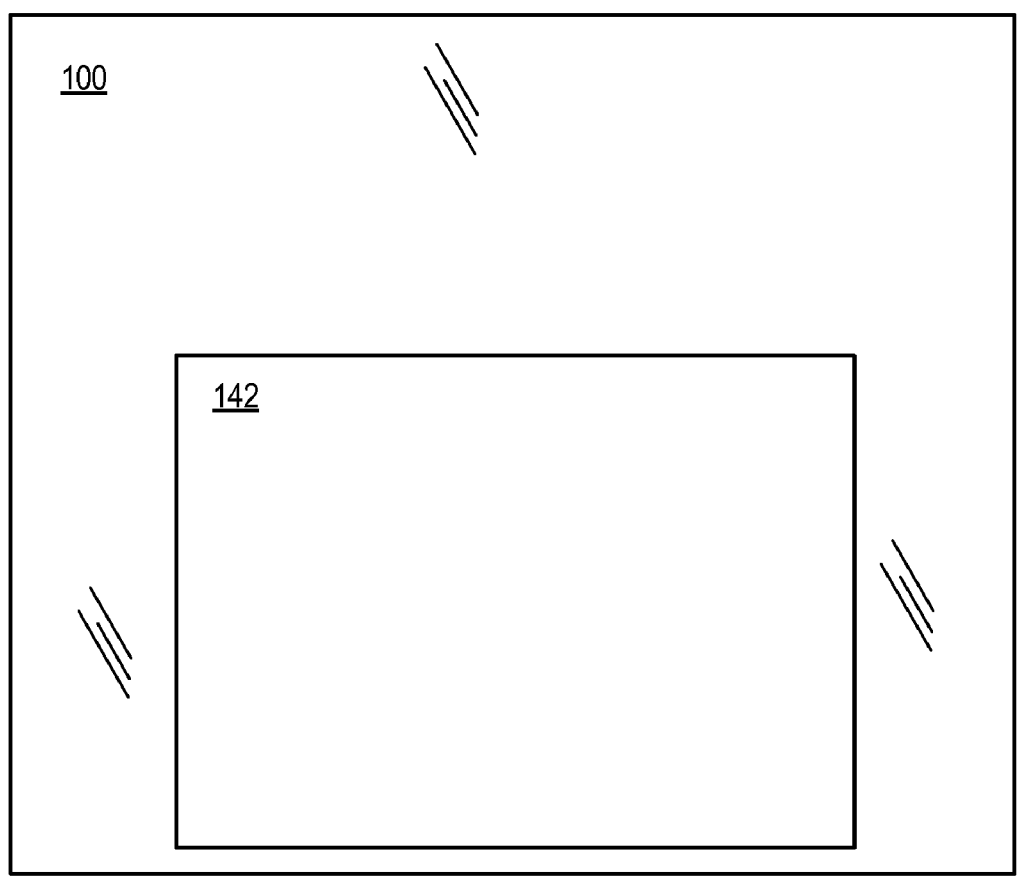
FIG. 14 is a top view of a completed semiconductor package according to an alternative embodiment of the present invention.

After traces 118$_0$ through 118$_3$ have been severed, the memory test pad matrix 120 and exposed portions of traces 118$_0$ through 118$_3$ may be covered with a cover 142 in step 216 and as shown in FIG. 14. The cover 142 may be a sticker or a layer applied by ink-jet printing or other process.

In the above-described embodiments, processes were performed on electrical traces 118$_0$ through 118$_3$ so as to short the traces together during testing, and electrically isolate the traces thereafter during normal read/write/erase operations under the control of controller die 110. In further embodiments of the present invention, it is contemplated that CE signal test pad 122 be configured in such a way so as to remove the need to sever the electrical traces 118$_0$ through 118$_3$ after burn-in and electrical tests.

In one such embodiment described with reference to FIGS. 15 through 18, the conductance pattern 118 is formed in substrate 114 so that respective traces 118$_0$ through 118$_3$ contact four separate and distinct areas on CE signal test pad 122. For example, as shown in the enlarged view of CE signal test pad 122 in FIG. 17, trace 118$_0$ may contact a first area 154, second trace 118$_1$ may contact a second area 156, third trace 118$_2$ may contact a third area 158 and fourth trace 118$_3$ may contact a fourth area 160. Each of the areas 154 through 160 on test pad 122 is electrically isolated from one another. Accordingly, each of the traces 118$_0$ through 118$_3$ are electrically isolated from each other and controller die 110 can communicate individual CE signals to one or more of the memory die 102 without having to sever any of the traces 118.

Figure 15:
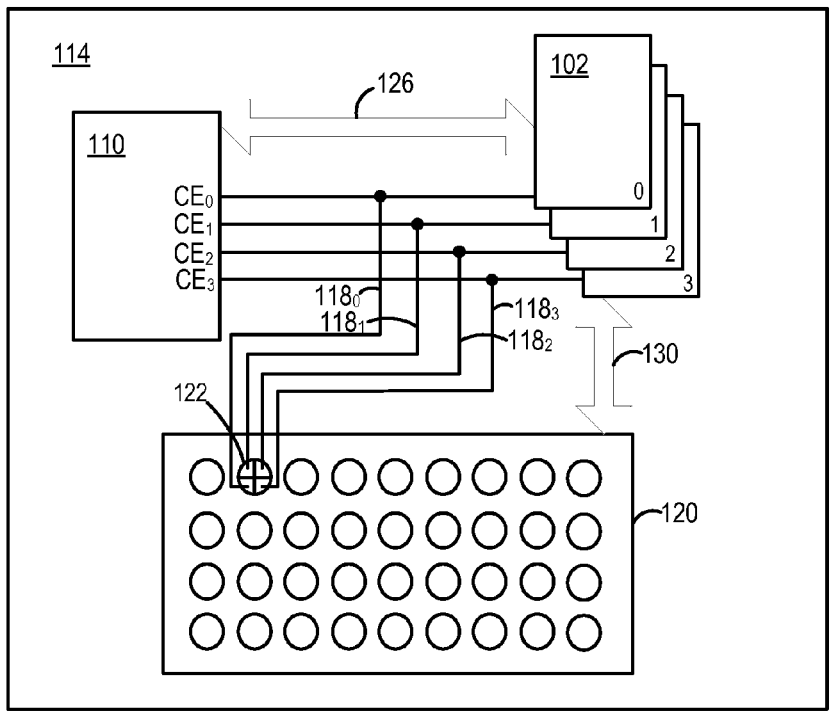
FIG. 15 is a top view of a semiconductor package according to a further alternative embodiment of the present invention during a first stage of fabrication.
Figure 16:
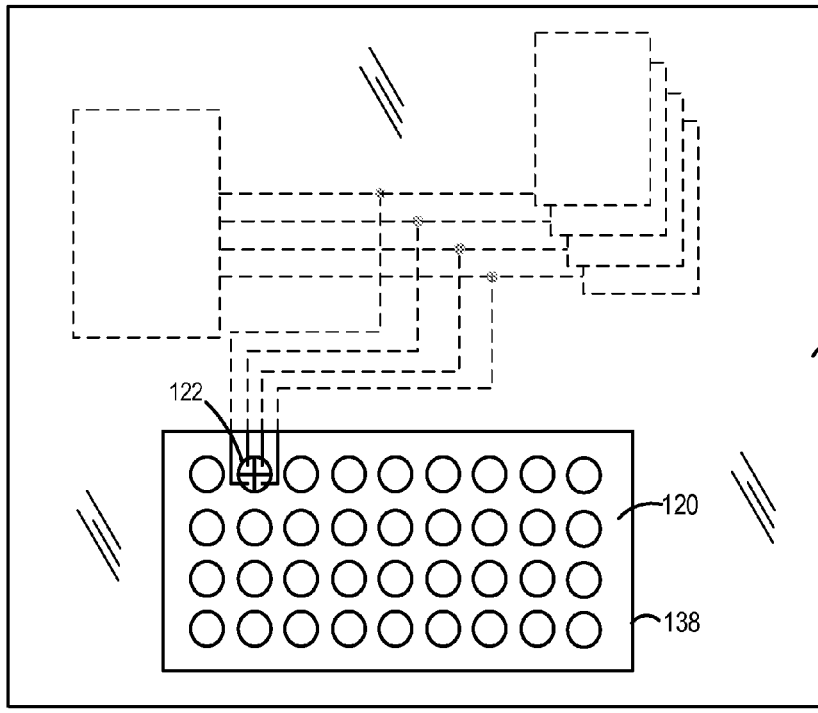
FIG. 16 is a top view of a semiconductor package according to a further alternative embodiment of the present invention during a second stage of fabrication.

As shown in FIGS. 15 and 16, the conductance pattern may be formed on the PCB 114 with traces 118$_0$ through 118$_3$ terminating at electrically isolated areas on CE signal test pad 122. The die 102 and 110 may be mounted and electrically connected to the PCB 114, and the substrate, die and traces may be encapsulated in molding compound 136 as described above. In this embodiment, a window 138 may be defined in the molding compound exposing just the memory test pad matrix 120, and not portions of traces 118$_0$ through 118$_3$, though portions of traces 118$_0$ through 118$_3$ may be exposed in window 138 in alternative embodiments.

Figure 18:
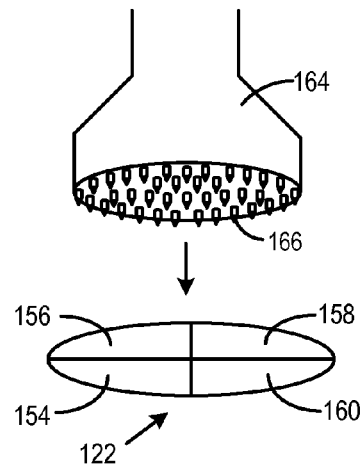
FIG. 18 is a perspective view of a test probe from a testing apparatus for providing a CE signal to the CE signal test pad according to embodiments of the present invention.

Referring now to FIG. 18, during burn-in and/or electrical tests, a probe 164 may be brought into contact with a probe landing area on CE signal test pad 122. Probe 164 establishes electrical contact with each of the areas 154 through 160 and provides a signal voltage to each of the traces 118$_0$ through 118$_3$ to enable each of the memory die 102 during testing. In embodiments of the invention, probe 164 may include a plurality of spring-loaded pins 166 on its lower surface, each of which pins being capable of independently retracting upon contact with respective areas 154 through 160. It is possible that a surface on or adjacent the CE signal test pad 122 has a raised surface, and it is possible that portions of the probe 164 contact the raised surface. Having independent spring-loaded retraction of pins 166 ensures good electrical contact of the probe 164 with each of the areas 154 through 160 on pad 122, even if a portion of the probe contacts a raised surface (the pins 166 contacting the raised surface will simply retract further.

Having a probe 164 capable of contacting and supplying a signal voltage to each of the different areas 154 through 160 together allows each of the memory die 102 to be enabled at the same time by probe 164 during the test processes. However, as each of the areas 154 through 160 are electrically isolated from each other, traces 118$_0$ through 118$_3$ extending therefrom are also electrically isolated from each other. Accordingly, after the test processes are completed and the probe 164 removed, each of the memory die 102 may be enabled individually by respective CE signals from the controller die 110. While four quadrants 154 through 160 are shown, it is understood that the CE signal test pad 122 may be divided into as many electrically conductive areas as there are memory die.

Figure 19:
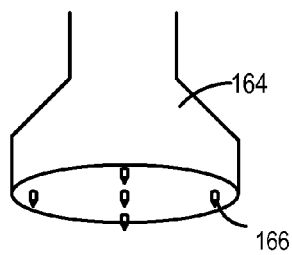
FIG. 19 is a perspective view of an alternative test probe from a testing apparatus for providing a CE signal to the CE signal test pad according to embodiments of the present invention.
Figure 20:
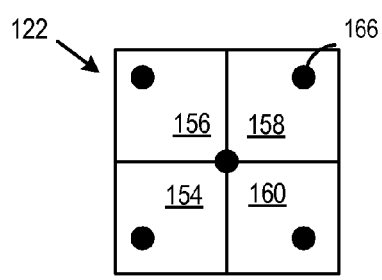
FIG. 20 is an enlarged view of a CE signal test pad of the memory test pad matrix according to an embodiment of the invention.
Figure 21:
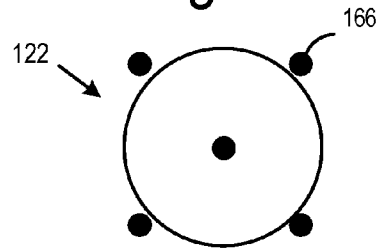
FIG. 21 is an enlarged view of an alternative CE signal test pad of the memory test pad matrix according to an embodiment of the invention.

In a further embodiment described with respect to FIGS. 19 through 21, the probe 164 may simply include five pins 166. As shown in FIG. 20, where CE signal test pad 122 is split into electrically isolated quadrants 154 through 160, one pin 166 may be positioned in each of the quadrants 154 through 160, and the fifth pin 166 may be positioned in the center. Thus, the probe may provide the CE signal to the signal traces off of each quadrant. As shown, the CE signal test pad 122 may be square instead of circular in embodiments. Referring to FIG. 21, the probe 164 may also be backward compatible, in that older test pads may be smaller and not subdivided into quadrants. In such embodiments, the center pin 166 ensures that at least one pin 166 contacts the CE signal test pad 122 to provide the CE signal. It is understood that retractable pins 166 may be omitted from the test probe in alternative embodiments of the present invention.

Figure 22:
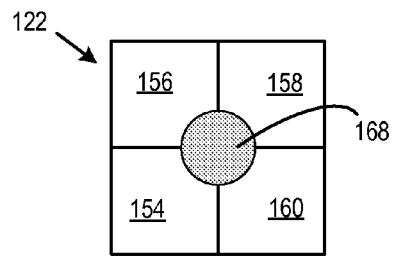
FIG. 22 is an enlarged view of further alternative CE signal test pad of the memory test pad matrix according to an embodiment of the invention.

FIG. 22 illustrates an example of a CE signal test pad 122 divided into four electrically isolated quadrants 154 through 160 as described above, and further including a conductive pad 168 provided at the center to short the quadrants together. Thus, during testing, the conductive pad 168 ensures that each of the quadrants is shorted together and that the CE signal applied by the probe is applied to each quadrant and each memory die. However, after testing the conductive pad 168 may be removed to electrically isolate each of the quadrants and traces extending therefrom as described above. The conductive pad may be made of solder having a low melting point, so that after testing, the pad may be heated and the solder removed. Alternatively, the conductive pad 168 may be a conductive adhesive which may be applied and removed as described above.

Figure 17:
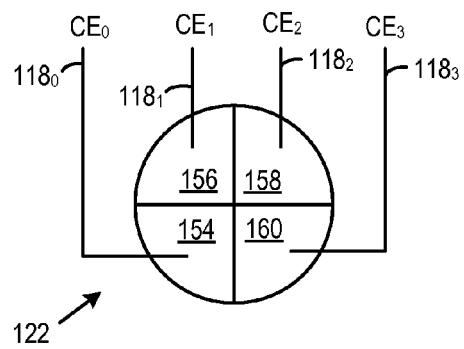
FIG. 17 is an enlarged view of the CE signal test pad of the memory test pad matrix according to the embodiment of FIGS. 15 and 16.
Figure 23:
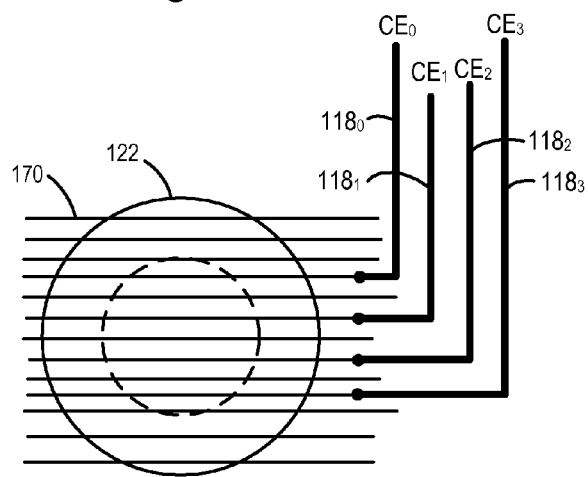
FIG. 23 is an enlarged view of a CE signal test pad according to a further alternative embodiment of the present invention.
Figure 24:
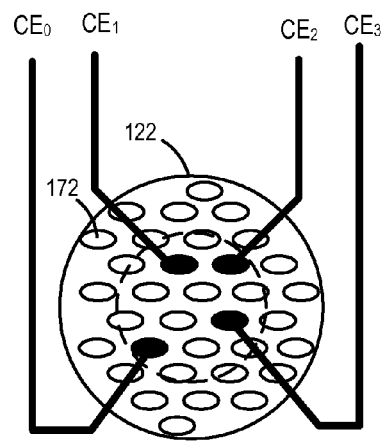
FIG. 24 is an enlarged view of a CE signal test pad according to a still further alternative embodiment of the present invention.

While FIG. 17 shows one embodiment having electrically isolated areas, those of skill in the art will appreciate a variety of other possible configurations where CE signal test pad 122 may have a plurality of isolated, electrically conductive areas off of which extend the respective traces $118_0$ through $118_3$. In each such embodiment, each of the conductive areas may be contacted simultaneously by a single probe during burn-in and/or electrical test of the package 100. Two examples of alternative configurations are shown in FIGS. 23 and 24. In FIG. 23, CE signal test pad 122 may include a plurality of electrical traces 170 photolithographically defined on the pad 122 during the process for defining the conductance pattern onto substrate 114. Each of the electrical traces 170 may be electrically isolated from each other by an insulative material such as a dielectric. The respective CE signal traces $118_0$ through $118_3$ may be connected to separate ones of these traces 170, thus maintaining electrical isolation of the respective CE signal traces $118_0$ through $118_3$. However, a single probe, such as for example probe 164, is capable of energizing each of the traces $118_0$ through $118_3$ during the test processes by contacting the respective traces 170 together.

FIG. 24 is a further alternative embodiment where a plurality of discrete and electrically isolated conductive dots 172 may be formed on pad 122 when the conductance pattern 118 is defined on substrate 114. Each of the conductive dots 172 may be electrically isolated from each other by an insulative material such as a dielectric. The respective CE signal traces $118_0$ through $118_3$ may be connected to separate ones of these dots 172, thus maintaining electrical isolation of the respective CE traces $118_0$ through $118_3$. However, a single probe, such as for example probe 164, is capable of energizing each of the traces $118_0$ through $118_3$ during the test processes by contacting the respective dots 172 together. The shape of the dots 172 may vary in alternative embodiments.

Although NAND type flash memory has been principally described for exemplary purposes, the present disclosure is not so limited and has application to numerous types of integrated circuits. In principle, embodiments can be used in any type of circuit including addressable die. Other embodiments may include NOR type flash memory and volatile memories such as SRAM and DRAM.

Moreover, the foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage device, comprising:
   a substrate;
   a controller die mounted to the substrate;
   a plurality of memory die mounted to the substrate and electrically coupled to the controller die, the controller die including separate circuit enable signal couplings to each of the plurality of memory die after fabrication of the storage device to allow the controller die to enable one or more of the plurality of memory die independently of others of the plurality of memory die;
   a memory test pad matrix including a circuit enable signal test pad, the circuit enable signal test pad including an electrical coupling to each of the plurality of memory die during fabrication of the storage device; and
   a molding compound for encapsulating the controller die and memory die but including an opening leaving at least portions of the memory test pad matrix and at least a portion of a trace coupling the memory test pad matrix to a memory die of the plurality of memory die exposed.

2. A non-volatile storage device as recited in claim 1, wherein the plurality of memory die comprise between two and eight memory die.

3. A non-volatile storage device as recited in claim 1, wherein the plurality of memory die comprise four memory die.

4. A non-volatile storage device as recited in claim 1, wherein the plurality of memory die comprise one of NAND type flash memory, NOR type flash memory, SRAM and DRAM.

5. A non-volatile storage device as recited in claim 1, wherein the controller die and plurality of memory die are positioned on a first side of the substrate and memory test pad matrix is provided on a second side of the substrate opposite the first side.

6. A non-volatile storage device as recited in claim 1, wherein the controller die, plurality of memory die and the memory test pad matrix are provided on a first side of the substrate.

7. A non-volatile storage device, comprising:
   a substrate;
   a controller die mounted to the substrate;
   a plurality of memory die mounted to the substrate;

a memory test pad matrix for testing the operation of the plurality of memory die during fabrication of the storage device, the memory test pad matrix including a circuit enable signal test pad;

a first set of traces electrically coupled between the controller die and each of the plurality of memory die to allow the controller die to enable one or more of the plurality of memory die independently of others of the plurality of memory die;

a second set of traces, severed during fabrication of the storage device, at one time coupled between the circuit enable signal test pad and each of the plurality of memory die to allow a signal to the circuit enable signal test pad to enable each of the plurality of memory die together; and a molding compound encapsulating the controller die and plurality of memory die but leaving the memory test pad matrix and at least a portion of the second set of traces exposed.

8. A non-volatile storage device as recited in claim 7, wherein the plurality of memory die comprise between two and eight memory die.

9. A non-volatile storage device as recited in claim 7, wherein the controller die and plurality of memory die are positioned on a first side of the substrate and the memory test pad matrix is provided on a second side of the substrate opposite the first side.

10. A non-volatile storage device as recited in claim 9, further comprising molding compound for covering the first side of the substrate.

11. A non-volatile storage device as recited in claim 7, wherein the controller die, plurality of memory die and the memory test pad matrix are provided on a first side of the substrate.

12. A non-volatile storage device as recited in claim 11, further comprising a molding compound encapsulating the controller die and plurality of memory die but leaving at least a portion of the memory test pad matrix and at least a portion of the second set of traces exposed.

13. A non-volatile storage device, comprising:
a substrate;
a controller die mounted to the substrate;
a plurality of memory die mounted to the substrate;
a memory test pad matrix for testing the operation of the plurality of memory die during fabrication of the storage device, the memory test pad matrix including a circuit enable signal test pad, the circuit enable signal test pad including a plurality of conductive sections electrically isolated from each other;

a plurality of electrical traces, each electrical trace including a first portion electrically coupled to respective memory die and each electrical trace including a second portion electrically coupled to a respective conductive section of the plurality of conductive sections on the circuit enable signal test pad; and a molding compound encapsulating the controller die and plurality of memory die but leaving at least a portion of the memory test pad matrix and at least a portion of the plurality of electrical traces exposed.

14. A non-volatile storage device as recited in claim 13, each said electrical trace including a third portion electrically coupled to the controller die.

15. A non-volatile storage device as recited in claim 13, said plurality of conductive sections on the circuit enable signal test pad comprising sections separate by a plurality of linear, insulative sections each extending across the circuit enable signal test pad through a center of the circuit enable signal test pad.

16. A non-volatile storage device as recited in claim 13, said plurality of conductive sections on the circuit enable signal test pad comprising a plurality of linear conductive sections separated by a plurality of linear insulative sections.

17. A non-volatile storage device as recited in claim 13, said plurality of conductive sections on the circuit enable signal test pad comprising a plurality of conductive dots surrounded by insulative sections.

* * * * *